(12) United States Patent
Okamura

(10) Patent No.: US 6,864,764 B2
(45) Date of Patent: Mar. 8, 2005

(54) DIELECTRIC PORCELAIN COMPOSITION, AND DIELECTRIC RESONATOR AND NONRADIATIVE DIELECTRIC STRIP USING SAME

(75) Inventor: Takeshi Okamura, Kyoto (JP)

(73) Assignee: Kyocera Corporation, Kyoto (JP)

(*) Notice: Subject to any disclaimer, the term of this patent is extended or adjusted under 35 U.S.C. 154(b) by 295 days.

(21) Appl. No.: 10/177,600

(22) Filed: Jun. 19, 2002

(65) Prior Publication Data

US 2002/0193235 A1 Dec. 19, 2002

Related U.S. Application Data

(62) Division of application No. 09/818,268, filed on Mar. 26, 2001, now Pat. No. 6,440,883.

(30) Foreign Application Priority Data

Mar. 28, 2000 (JP) ........................ P2000-88183

(51) Int. Cl.$^7$ ............... H01P 1/22; H01P 1/26
(52) U.S. Cl. ...................... 333/239; 333/248
(58) Field of Search ............... 333/22 R, 81 B, 333/113, 239, 248; 428/210

(56) References Cited

U.S. PATENT DOCUMENTS 6,094,106 A * 7/2000 Kishino et al. ........... 333/22 R
6,440,883 B2 * 8/2002 Okamura ........................ 501/9

FOREIGN PATENT DOCUMENTS

| JP | 09-048661 | 2/1997 |
| JP | 09-295861 | 11/1997 |
| JP | 10-017361 | 1/1998 |
| JP | 10-167812 | 6/1998 |
| JP | 10-177817 | 6/1998 |
| JP | 10-188677 | 7/1998 |
| JP | 10-188678 | 7/1998 |
| JP | 2000-114816 | 4/2000 |

* cited by examiner

Primary Examiner—Cathy Lam
(74) Attorney, Agent, or Firm—Hogan & Hartson LLP

(57) ABSTRACT

An object of the invention is to provide a dielectric porcelain composition with low rate of phase change of a cordierite phase as a primary crystal phase, in which as a result of the low rate of phase change the dielectric constant is from 4.5 to 6 and Q value is 1,000 or more at 60 GHz, and to provide a dielectric resonator and nonradiative dielectric strip using the same. The dielectric porcelain composition comprises, as a principal component, a complex oxide having a molar composition $xMgO \cdot yAl_2O_3 \cdot zSiO_2$ (wherein $10 \leq x \leq 40$, $10 \leq y \leq 40$, $20 \leq z \leq 80$, and $x+y+z=100$), and a ratio of a (241) peak intensity $\beta p(241)$ and a (222) peak intensity $\beta p(222)$ of X-ray diffraction of a $\beta$ phase of a $2MgO \cdot 2Al_2O_3 \cdot 5SiO_2$ phase, which is a primary crystalline phase of the complex oxide, is $0.8 \leq \beta p(241)/\beta p(222) \leq 1.3$.

11 Claims, 1 Drawing Sheet

DIELECTRIC PORCELAIN COMPOSITION, AND DIELECTRIC RESONATOR AND NONRADIATIVE DIELECTRIC STRIP USING SAME

This is a divisional of application Ser. No. 09/818,268 filed Mar. 26, 2001 now U.S. Pat. No. 6,440,883, which application is here by incorporated by reference in its entirety.

BACKGROUND OF THE INVENTION

1. Field of the Invention

The present invention relates to a dielectric porcelain composition for high frequency waves, used in a high frequency band of e.g., microwaves or millimeter waves, particularly, to a dielectric porcelain composition useful as a material for circuit boards of microwave integrated circuits, millimeter waves integrated circuits and the like, dielectric strips and dielectric antennas used in a microwave band and a millimeter wave band, and to a dielectric resonator and nonradiative dielectric strip using the same.

2. Description of the Related Art

There have been cases in high frequency circuits such as microwave integrated circuits and millimeter wave integrated circuits that such a structure is employed that a dielectric porcelain for resonance is fixed on a dielectric board through a dielectric supporting member.

FIG. 1 is a cross sectional view showing a constitutional example of a dielectric resonator. That is an example of a dielectric resonator applied to a dielectric resonator control type microwave oscillator, constituted such that a dielectric porcelain 1 is attached to a dielectric board 3 through a dielectric supporting member 2 and is electromagnetically coupled to a strip line 4 formed on the dielectric board 3 by utilizing an electromagnetic field H which leaks outside the dielectric porcelain 1, which are housed in a metallic container 5.

Since a resonance system of high unloaded Q level can be constituted in the high frequency circuit by controlling the leakage of electric field of the dielectric porcelain 1 through the dielectric supporting member 2, it is necessary to use, for the dielectric supporting member 2, a material having a low dielectric constant and a small dielectric loss (tanδ), i.e., a large Q value. Therefore, forsterite (2MgO·SiO$_2$) ceramics having a dielectric constant of about 7 and a Q value at a measuring frequency of 10 GHz of about 15,000 has been used as the material for the dielectric supporting member 2, and alumina ceramics having a dielectric constant of about 10 and a Q value at a measuring frequency of 10 GHz of about 20,000 or more has been mainly used as the material for the dielectric board 3.

Cordierite (2MgO·2Al$_2$O$_3$·5SiO$_2$) ceramics has been known as a dielectric material having a low dielectric constant. Since a dense sintered body of the cordierite ceramics is difficult to obtain owing to its remarkably narrow sintering temperature range, glass ceramics has been known that is obtained by adding a glass material to result a dielectric constant of from 4 to 6 and a Q value at a measuring frequency of 10 GHz of about 1,000.

Furthermore, there has been known a nonradiative dielectric guide (hereinafter referred to as an NRD guide) having a guide for transmitting a high frequency signal comprising a dielectric material.

FIG. 2 is a partially cutaway perspective view showing a basic constitution of an NRD guide of the invention and the conventional art. An NRD guide S1 comprises a dielectric strip 12 intervening between a pair of parallel flat conductive bodies 11 and 13 having a distance of λ/2 or less, in which λ is the wavelength of a high frequency signal (electromagnetic wave), such as a millimeter wave, propagating in the dielectric strip 12. In the NRD guide S1, the electromagnetic wave is shielded and cannot enter from the outside when the distance of the parallel flat conductive bodies 11 and 13 is ½ or less of the wavelength λ of the high frequency signal, but when the dielectric strip 12 is made intervene between the parallel flat conductive bodies 11 and 13, the electromagnetic wave can propagate along the dielectric strip 12 inside the same, and a radiation wave is suppressed by the shielding effect of the parallel flat conductive bodies 11 and 13. In FIG. 2, a part of the upper parallel flat conductive body 13 is cut for viewing the interior. The wavelength λ of the high frequency signal is that at the use frequency in the air.

The electromagnetic wave propagation mode of the NRD guide S1 includes two modes, i.e., the LSM (longitudinal section magnetic) mode and the LSE (longitudinal section electric) mode, and the LSM mode that exhibits a small loss is generally employed.

A curved dielectric strip 12 can also be used, and in this case, since an electromagnetic wave can easily be propagated in a curvilinear form, an advantage can be obtained in that a millimeter wave integrated circuit can be downsized, and high flexibility in circuit design can be obtained.

As the material of the dielectric strip 12 of the NRD guide S1, a resin material having a dielectric constant of from 2 to 4, such as Teflon and polystyrene, has been conventionally used owing to its easiness in processing.

However, the dielectric constants of alumina ceramics and forsterite ceramics used in the conventional resonator are about 10 and about 7, respectively, and therefore, a material having a lower dielectric constant is being demanded associated with spreading of a dielectric resonator for a high frequency band in recent years.

On the other hand, porcelain, such as glass ceramics, which is generally used as a low dielectric constant material, has a small dielectric constant of about from 4 to 6 but has a Q value of about 1,000 at 10 GHz, and therefore, a low dielectric constant material having a higher Q value is being demanded associated with spreading of a dielectric resonator for a high frequency band in recent years.

Furthermore, since alumina ceramics, which is mainly used as the dielectric board 3 of the dielectric resonator, has a relatively high dielectric constant of about 10, it involves such a problem that when a strip line of a high impedance is to be formed, the line width is too decreased to about 1 μm or less to cause breakage, and fluctuation in the relative line width is increased, whereby the defective fraction is increased when a microwave integrated circuit is fabricated by using the dielectric resonator.

This is because the impedance of the strip line in the dielectric board 3 is inversely proportional to the dielectric constant thereof and the width of the strip line, respectively, assuming that the thickness of the dielectric board 3 is constant. Therefore, the impedance can be increased by using a material having a lower dielectric constant instead of reduction in the width of the strip line. Thus, a material having a low dielectric constant is being demanded.

In order to solve the problems, the inventors have proposed a dielectric porcelain composition for a high frequency and a dielectric resonator, which comprise a complex oxide containing Mg, Al and Si as metallic elements, in which the molar composition of the respective metallic elements in the oxide xMgO·yAl$_2$O$_3$·zSiO$_2$ satisfies 10≦x≦40, 10≦y≦40, 20≦z≦80, and x+y+z=100, the dielectric constant is 6 or less, and the Q value of 2,000 or more at a measuring frequency of 10 GHz (Japanese Unexamined Patent Publication JP-A 9-48661 (1997)).

The dielectric porcelain composition for high frequencies is of excellent properties as having a dielectric constant lower than those of alumina ceramics and forsterite ceramics, and a Q value higher than that of glass ceramics. However, a dielectric porcelain composition exhibiting a high Q value at a higher frequency is still demanded.

When the conventional NRD guide is constituted by a dielectric strip using a dielectric material comprising a resin material, such as Teflon and polystyrene, there is a problem that the curvature loss at a curved part of the dielectric strip and the loss at a junction of the dielectric strips are large. Therefore, a sharp curved part cannot be formed in the dielectric strip, which brings about, as a result, such a problem that the NRD guide has a large size. In the case where a loose curved part is formed in the dielectric strip, it is necessary that the curvature of the curved part be precisely determined to suppress the high frequency signal loss.

Furthermore, the frequency range that can be used under the condition that the curvature loss is small is 1 to 2 GHz in the vicinity of 60 GHz, which is insufficient. This is because in the case where the NRD guide is constituted with a dielectric material having a dielectric constant of from 2 to 4, the distance between the LSM mode and the LSE mode is too close as about 3 GHz, and thus a part of the electromagnetic wave in the LSM mode is converted to the LSE mode. That is, with respect to the diffusion characteristics of the LSM mode and the LSE mode, the diffusion curves of the two modes is separated from each other by only about 3 GHz at B/B0=0 (B represents a propagation constant of a high frequency signal in a dielectric strip, and B0 represents a propagation constant of a high frequency signal in vacuum), which causes the conversion of a part of the electromagnetic wave in the LSM mode to the LSE mode. There has been a product using ceramics having a dielectric constant of about 10, such as alumina, as the material of the dielectric strip, but in order to use it at a high frequency of 50 GHz of higher, it is necessary that the width of the dielectric strip is extremely narrow, and it is not practical on processability and workability of fabrication, i.e., on productivity.

Furthermore, the cross section of the dielectric strip becomes smaller when the frequency becomes higher. For example, in the case where a dielectric strip having a cross sectional size of about 1 mm×2 mm and a length of about 10 mm is formed with porcelain and arranged, a problem occurs in that the dielectric strip is extremely liable to broken on handling upon production. Moreover, it is necessary to retain the dielectric strip by a pair of parallel flat conductive bodies, but a problem occurs in that the dielectric strip is broken upon fastening with the parallel flat conductive bodies.

SUMMARY OF THE INVENTION

An object of the invention is to provide a dielectric porcelain composition in which phase conversion of a phase to β phase of a cordierite phase as a primary crystalline phase is not large, i.e., the phase conversion to β phase does not sufficiently proceed, so as to have a dielectric constant of from 4.5 to 6 and a Q value of 1,000 or more at 60 GHz. Another object of the invention is to increase impedance in a dielectric resonator by using a dielectric board material of low dielectric constant comprising the dielectric porcelain composition, instead of by reducing the width of a strip line on a dielectric board. Still another object of the invention is to provide an NRD guide using a dielectric strip with small conversion from LSM mode to LSE mode of electromagnetic waves, comprising the dielectric porcelain composition and having a curved part, so as to broaden the usable frequency range even when the sharp curved part is used, whereby a millimeter wave integrated circuit can be downsized with high workability and high freedom on design.

The invention provides a dielectric porcelain composition comprising, as a principal component, a complex oxide having a molar composition xMgO·yAl$_2$O$_3$·zSiO$_2$ (wherein 10≦x≦40, 10≦y≦40, 20≦z≦80, and x+y+z=100), a primary crystalline phase of the complex oxide being a 2MgO·2Al$_2$O$_3$·5SiO$_2$ phase, and a ratio of a (241) peak intensity βp(241) and a (222) peak intensity βp(222) of X-ray diffraction of a β phase of the primary crystalline phase being 0.8≦βp(241)/βp(222)≦1.3.

According to the invention, the principal component of the dielectric porcelain composition is the complex oxide having a molar composition of the specific range, and the primary crystalline phase thereof is the cordierite (2MgO·2Al$_2$O$_3$·5SiO$_2$) phase of the specific phase conversion state, whereby such characteristics can be obtained that the dielectric constant is from 4.5 to 6.0, and the Q value is 1,000 or more at 60 GHz.

In the invention it is possible that the dielectric porcelain composition contains 0.1 part by weight or less of an alkali metal element in terms of an oxide per 100 parts by weight of the complex oxide.

According to the invention, the rate of phase conversion of the a phase to the β phase of the cordierite (2MgO·2Al$_2$O$_3$·5SiO$_2$) phase as the primary crystalline phase is made slow by decreasing the content of an alkali metal element, so as to put the cordierite phase to the β phase which is in a state closer to the α phase, whereby a dielectric porcelain composition exhibiting high Q value can be stably obtained.

In the invention it is preferable that the alkali metal element is potassium.

According to the invention, by making small the content of potassium, which particularly makes faster the rate of phase conversion of the a phase to the β phase of the cordierite (2MgO·2Al$_2$O$_3$·5SiO$_2$) phase, the cordierite phase can be easily put to the β phase which is in a state closer to the a phase, whereby a dielectric porcelain composition exhibiting high Q value can be stably obtained.

In the invention it is preferable that the dielectric porcelain composition contains 0.1 to 15 parts by weight of a rare earth element in terms of an oxide per 100 parts by weight of the complex oxide.

According to the invention, since the dielectric porcelain composition contains a certain amount of a rare earth element, the sintering conditions of the dielectric porcelain composition can be improved without largely deteriorating the characteristics such as Q value. That is, in order to obtain such characteristics that the dielectric constant is from 4.5 to 6.0, and the Q value is 1,000 or more at a measuring frequency of 60 GHz, the sintering temperature range can be broadened to about 100° C., which has been conventionally controlled with a width of about 10° C., whereby the production thereof becomes easy to remarkably improve the mass productivity.

In the invention it is preferable that the rare earth element is at least one selected from the group consisting of Tb, Dy, Ho, Er, Yb and Lu.

According to the invention, sintering can be conducted at a low temperature particularly without deterioration of Q value, whereby the production of the dielectric porcelain composition becomes easy to remarkably improve the mass productivity.

The invention provides a dielectric resonator comprising:

a dielectric board;

a dielectric supporting member; and a dielectric porcelain for resonance having a higher dielectric constant than that of the supporting member, the dielectric porcelain provided on the dielectric board via the dielectric supporting member, the dielectric board and/or the dielectric supporting member comprising a dielectric porcelain composition which comprises, as a principal component, a complex oxide having a molar composition $xMgO \cdot yAl_2O_3 \cdot zSiO_2$ (wherein $10 \leq x \leq 40$, $10 \leq y \leq 40$, $20 \leq z \leq 80$, and $x+y+z=100$), a primary crystalline phase of the complex oxide being a $2MgO \cdot 2Al_2O_3 \cdot 5SiO_2$ phase, and a ratio of a (241) peak intensity $\beta p(241)$ and a (222) peak intensity $\beta p(222)$ of X-ray diffraction of a $\beta$ phase of the primary crystalline phase being $0.8 \leq \beta p(241)/\beta p(222) \leq 1.3$.

According to the invention, since the dielectric supporting member is of low dielectric constant and of large Q value, leakage of the electric field of the dielectric porcelain through the dielectric supporting member can be controlled, whereby a resonance system of high unloaded Q can be constituted. Furthermore, since the dielectric board is of low dielectric constant, the impedance can be increased without reduction in the line width of the strip line. According to the constitution, a high frequency circuit such as a microwave integrated circuit, can be produced with high reliability.

In the invention it is preferable that the dielectric porcelain composition contains 0.1 part by weight or less of an alkali metal element in terms of an oxide per 100 parts by weight of the complex oxide.

According to the invention, the dielectric board and/or the dielectric supporting member exhibiting high Q value can be stably obtained by decreasing the content of an alkali metal element in the dielectric porcelain composition, whereby a high frequency circuit such as a microwave integrated circuit can be produced with high reliability.

In the invention it is preferable that the alkali metal element is potassium.

According to the invention, the dielectric porcelain composition exhibiting high Q value can be stably obtained by decreasing the content of potassium in the dielectric porcelain composition, whereby a high frequency circuit such as a microwave integrated circuit can be produced with high reliability.

In the invention it is preferable that the dielectric porcelain composition contains 0.1 to 15 parts by weight of a rare earth element in terms of an oxide per 100 parts by weight of the complex oxide.

According to the invention, the sintering conditions of the dielectric porcelain composition can be improved without largely deteriorating the characteristics thereof, such as the Q value, by containing a certain amount of a rare earth element, whereby the production thereof becomes easy to remarkably improve the mass productivity.

In the invention it is preferable that the rare earth element is at least one selected from the group consisting of Tb, Dy, Ho, Er, Yb and Lu.

According to the invention, sintering can conducted at a low temperature particularly without deterioration of the Q value, by containing the certain rare earth element, whereby the production of the dielectric porcelain composition becomes easy to remarkably improve the mass productivity.

The invention also provides a nonradiative dielectric strip comprising:

a pair of parallel flat conductive bodies arranged with a distance of ½ or less of a wavelength of a high frequency signal; and a dielectric strip disposed between the parallel flat conductive bodies, for transmitting the high frequency signal, the dielectric strip comprising a dielectric porcelain composition which comprises, as a principal component, a complex oxide having a molar composition $xMgO \cdot yAl_2O_3 \cdot zSiO_2$ (wherein $10 \leq x \leq 40$, $10 \leq y \leq 40$, $20 \leq z \leq 80$, and $x+y+z=100$), a primary crystalline phase of the complex oxide being a $2MgO \cdot 2Al_2O_3 \cdot 5SiO_2$ phase, and a ratio of a (241) peak intensity $\beta p(241)$ and a (222) peak intensity $\beta p(222)$ of X-ray diffraction of a $\beta$ phase of the primary crystalline phase being $0.8 \leq \beta p(241)/\beta p(222) \leq 1.3$.

In the invention it is preferable that the dielectric porcelain composition contains 0.1 part by weight or less of an alkali metal element in terms of an oxide per 100 parts by weight of the complex oxide.

In the invention it is preferable that the alkali metal element is potassium.

In the invention it is preferable that the dielectric porcelain composition contains 0.1 to 15 parts by weight of a rare earth element in terms of an oxide per 100 parts by weight of the complex oxide.

In the invention it is preferable that the rare earth element is at least one selected from the group consisting of Tb, Dy, Ho, Er, Yb and Lu.

In the invention it is preferable that a dielectric constant of the dielectric porcelain composition is from 4.5 to 6.

According to the invention, the dielectric strip for transmitting a high frequency signal comprising the dielectric porcelain composition having the specified characteristics is provided between the pair of parallel flat conductive bodies arranged with a distance of ½ or less of a wavelength of a high frequency signal, and thus the dielectric constant of the dielectric strip becomes about from 4.5 to 6.0, which is higher than the conventional resin material, such as Teflon, but lower than alumina ceramics, whereby the loss caused by conversion of the electromagnetic wave in the LSM mode to the LSE mode can be decreased. When a dielectric porcelain having a Q value of 1,000 or more at a using frequency of 60 GHz is used, the transmission loss can be small, and the width of the dielectric strip is not necessarily extremely narrow to easily form the dielectric strip, whereby the dielectric strip can be produce at a low cost with high accuracy. Furthermore, since the dielectric constant of the dielectric strip is higher than the resin material, such as Teflon, the influence of the resin material can be suppressed even when a supporting jig and a circuit board of the dielectric strip are formed with the resin material. Accordingly, an NRD guide of a small size and a low cost with a high degree of freedom on production can be constituted.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
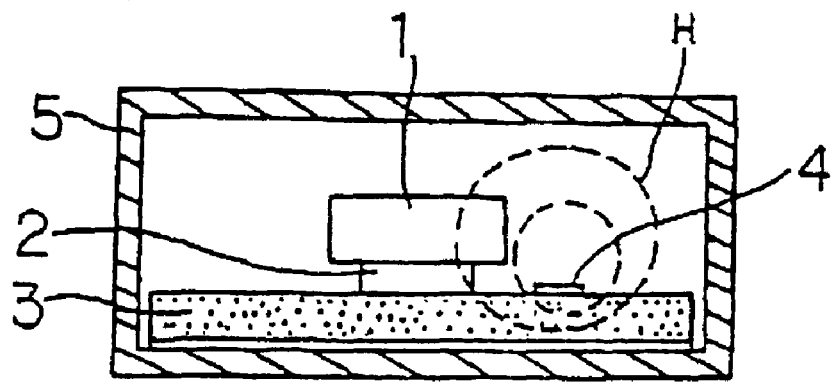
FIG. 1 is a cross sectional view showing a constitutional example of a dielectric resonator of the invention and the conventional art.

The dielectric porcelain composition for high frequency, the dielectric resonator and the NRD guide according to the invention will be sequentially described below.

The dielectric porcelain composition of the invention comprises, as a principal component, a complex oxide having a molar composition $xMgO \cdot yAl_2O_3 \cdot zSiO_2$ (wherein $10 \leq x \leq 40$, $10 \leq y \leq 40$, $20 \leq z \leq 80$, and $x+y+z=100$), in which the primary crystalline phase of the complex oxide is a $2MgO \cdot 2Al_2O_3 \cdot 5SiO_2$ phase, and the ratio of a (241) peak intensity $\beta p(241)$ and a (222) peak intensity $\beta p(222)$ of X-ray diffraction of the β phase of the primary crystalline phase is $0.8 \leq \beta p(241)/\beta p(222) \leq 1.3$.

The numeral (241) referred to herein means the azimuth of a (241) crystal plane defined by JCPDS-ICDD (Joint Committee on Powder Diffraction Standards International Center for Diffraction Data), and the azimuths of the other crystal planes are the same.

The reasons of the limitation on the compositional ratio of the principal component of the dielectric porcelain composition to the specified ranges are as follows. The molar ratio x (mol%) of MgO is from 10 to 40 because a good sintered body is difficult to obtain, and the Q value is liable to be low when x<10, whereas the dielectric constant exceeds 6.0 when x>40. It is preferred that x is from 15 to 35, and in this case, the Q value is remarkably improved to 2,000 or more at 60 GHz.

The molar ratio y (mol%) of $Al_2O_3$ is from 10 to 40 because a good sintered body is difficult to obtain, and the Q value becomes low when y<10, whereas the dielectric constant exceeds 6 when y>40. It is preferred that y is from 17 to 35, and in this case, the Q value is remarkably improved to 2,000 or more at 60 GHz.

The molar ratio z (mol%) of $SiO_2$ is from 20 to 80 because the dielectric constant exceeds 6 when z<20, whereas a good sintered body is difficult to obtain, and the Q value becomes low when z>80. It is preferred that z is from 30 to 65, and in this case, the Q value is remarkably improved to 2,000 or more at 60 GHz.

Therefore, in order to obtain a Q value of 2,000 or more at a measuring frequency of 60 GHz, it is preferred that x is from 15 to 35, y is from 17 to 35, and z is from 30 to 65, and it is the most preferred that the composition is the cordierite composition, i.e., x=22.2, y=22.2 and z=55.6.

The molar percentages x, y and z of MgO, $Al_2O_3$ and $SiO_2$ in the complex oxide can be determined by an analysis method, such as an EPMA (electron probe microanalysis) method and an XRD (X-ray diffraction) method.

As described in the foregoing, the dielectric porcelain composition exhibiting a Q value of 1,000 or more at a measuring frequency of 60 GHz can be sufficiently adapted to a dielectric resonator for a high frequency band in recent years. While the better, the higher the Q value is, it is preferred that the Q value is 1,500 or more at a measuring frequency of 60 GHz.

In the dielectric porcelain composition according to the invention, the ratio of the (241) peak intensity $\beta p(241)$ and the (222) peak intensity $\beta p(222)$ of X-ray diffraction of the β phase of the cordierite phase as the primary crystalline phase is defined as $0.8 \leq \beta p(241)/\beta p(222) \leq 1.3$. The reasons of the limitation are that the dielectric loss becomes too large due to excessive progress of phase change from the a phase to the β phase when $\beta p(241)/\beta p(222)<0.8$, and the state where $\beta p(241)/p(222)=1.3$ means the α phase, i.e., the most preferred crystal state, but $\beta p(241)/\beta p(222)$ does not exceed 1.3.

The reasons described in the foregoing will be specifically described below. It has been known that the crystal phase of cordierite includes the a phase and the β phase, which reversibly cause phase change (phase conversion) by a heat treatment. While the phase conversion is a slight change of the crystal lattice, the state of the phase change can be specified by measuring the change of the X-ray diffraction patterns caused by the change of the symmetry of the crystal, i.e., the change of the peak intensity of X-ray diffracted at various angles caused by the state of the crystal.

The α phase, which is the most preferred from the standpoint that the dielectric constant is small and the dielectric loss is small, changes into the β phase upon sintering to produce the dielectric porcelain composition. The peak intensity caused by an X-ray (wavelength: 1.5406 Å) at the specific crystal plane changes associated with the phase conversion from the α phase to the β phase. The peak of (211) of the α phase changes into the three peaks of (151), (241) and (311) of the β phase associated with the phase conversion from the α phase to the β phase. That is, the one peak of (211) of the α phase is decreased in height and is separated into the three peaks associated with the change in the crystal structure of the β phase (change in ratio of the length in the x axis direction to the length in the y axis direction of the crystal).

With respect to the (202) peak of the a phase, the peak has no relationship to the phase conversion, and the peak intensity cause no change. However, since the unit lattice changes into the β phase associated with the phase change, it corresponds to the (222) peak in the β phase.

Consequently, the state of phase conversion of cordierite can be specified by the ratio of the (222) peak intensity of the β phase that causes no change in peak intensity by the phase change to the peak intensity of (151), (241) and (311) that cause change in peak intensity by the phase change. Following to the progress of the phase conversion, the (241) peak, which is of the largest peak intensity among the peaks of (151), (241) and (311) of the β phase, becomes small, and the (151) peak and the (311) peak are formed on the both sides thereof. Therefore, the state of the phase conversion can be specified by the ratio in intensity of the (222) peak to the (241) peak in the β phase, i.e., $\beta p(241)/\beta p(222)$.

In the complex oxide as the-principal component of the dielectric porcelain composition, which is a sintered body (ceramics), cordierite ($2MgO \cdot 2Al_2O_3 \cdot 5SiO_2$) in the foregoing phase state is the primary crystal phase, and the complex oxide may contain other crystal phases or may contain only the crystal phase of cordierite. There are cases that mullite ($3Al_2O_3 \cdot 2SiO_2$), spinel ($MgO \cdot Al_2O_3$), protoenstatite (a kind of steatite having magnesium metasilicate ($MgO \cdot SiO_2$) as a principal component), clinoenstatite (a kind of steatite having magnesium metasilicate ($MgO \cdot SiO_2$) as a principal component), forsterite ($2MgO \cdot SiO_2$), cristobalite (a kind of silicate ($SiO_2$)), tridymite (a kind of silicate ($SiO_2$)) and sapphirine (a kind of silicate of Mg and Al) are deposited on sintering. The deposited phase is changed depending on the compositional ratio of MgO, $Al_2O_3$ and $SiO_2$.

The dielectric porcelain composition of the invention comprises the complex oxide as the main component and further contains an alkali metal element, such as Li, Na, K and Rb, and a rare earth element, such as Sc, Y, La, Ce, Pr, Nd, Pm, Sm, Eu, Gd, Tb, Dy, Ho, Er, Tm, Yb and Lu.

In the dielectric porcelain composition of the invention, the content of an alkali metal element is preferably 0.1 part by weight or less in terms of an oxide per 100 parts by weight of the complex oxide. When it exceeds 0.1 part by weight, the cordierite phase as the primary crystal phase is liable to change from the α phase to the β phase to decrease the Q value. The better, the smaller the content of an alkali metal element, and it is more preferably 0.03 part by weight or less. While an alkali metal element may not be mixed, the element or an oxide thereof is mixed as an impurity of a pulverization bowl or raw material powder or as an object of improving the sintering property.

The rate of phase change from the α phase to the β phase is increased to lower the Q value particularly by incorporating potassium among the alkali metal elements, and it is therefore preferred that the content of potassium is 0.1 part by weight or less.

In the dielectric porcelain composition of the invention, the content of a rare earth element is preferably from 0.1 to 15 parts by weight in terms of an oxide per 100 parts by weight of the complex oxide as the principal component. When the content is less than 0.1 part by weight, the range of the sintering temperature, in which the characteristics of a dielectric constant of from 4.5 to 6 and a Q value of 1,000 or more at a measuring frequency of 60 GHz are obtained, is not broadened, whereby the dielectric porcelain composition having such characteristics is difficult to be obtained to deteriorate mass productivity. When it exceeds 15 parts by weight, the dielectric constant becomes large, and the Q value becomes small.

Among the rare earth elements, Tb, Dy, Ho, Er, Yb and Lu are preferred from the standpoint that low temperature sintering can be conducted without decreasing the Q value, and Yb is the most preferred.

The content of an oxide of an alkali metal element can be specified by atomic absorption spectrophotometry, and the content of an oxide of a rare earth element can be specified by the EPMA method or the XRD method.

The dielectric porcelain composition of the invention can be produced in the following manner. For example, $MgCO_3$ powder, $Al_2O_3$ powder, $SiO_2$ powder and $Yb_2O_3$ powder as raw material powder are weighed at a prescribed proportion and mixed in a wet state, followed by drying. The resulting mixture is calcined in the air at a temperature of from 1,100 to 1,300° C., followed by pulverization. Prescribed amounts of powder of an oxide of an alkali metal and powder of an oxide of a rare earth element are added to the resulting raw material powder depending on necessity, and an appropriate amount of an organic resin binder is added thereto, followed by forming into a shape of a guide. The resulting molded article is sintered at a temperature of from 1,250 to 1,450° C. in the air to obtain the dielectric porcelain composition.

In the dielectric porcelain composition of the invention, one having no progress of phase conversion to the β phase can be produced by controlling the sintering temperature and the sintering time. That is, a product of $0.8 \leq \beta p(241)/\beta p(222) \leq 1.3$ can be produced. The preferred temperature range where sintering can be conducted is from 1,250 to 1,450° C. When the temperature is less than 1,250° C., sintering is difficult to be conducted, whereas when it exceeds 1,450° C., the cordierite phase is liable to be decomposed and melted. The sintering time where the phase conversion is hard to proceed is preferably less than 2 hours, and the phase conversion proceeds when it is 2 hours or more. Therefore, the phase conversion to the β phase can be suppressed to the range of the invention by a sintering temperature range of from 1,250 to 1,450° C. and a sintering time of less than 2 hours. The sintering time is more preferably 90 minutes or less. In the case where the sintering temperature is from 1,400 to 1,450° C. where the phase change of the β phase of the cordierite phase actively proceed, the sintering time is preferably 1 hour or less. Sintering becomes difficult when the sintering time is less than 5 minutes even in the case of a small size part, such as a dielectric board and a dielectric supporting member of a dielectric resonator or a dielectric strip of an NRD guide, and therefore the sintering time is preferably 5 minutes or more.

The respective elements of Mg, Al and Si contained in the dielectric porcelain composition are not limited to the oxide raw material powder used in the foregoing production process of the dielectric porcelain composition, and any substance that can form an oxide upon baking, for example, an inorganic compound, such as a carbonate and an acetate, and an organic compound, such as an organic metal, may be used as a raw material.

The dielectric porcelain composition of the invention contains Mg, Al and Si as the principal component elements and also contains an alkali metal element or a rare earth element depending on necessity, and there are some cases where other elements, such as Ca, Ba, Fe, Cr, P, Sr, Ni, Co, In, Ga, Zr, Ti, Nb, Ta, Mo, W, Mn, Cu, Zn, B, Ge and Sm, are contained as an impurity of a pulverization bowl or raw material powder or as an object of improving the sintering property. In this case, a dielectric porcelain composition having a low dielectric constant and a high Q value can also be obtained as far as the principal component elements constitute the complex oxide satisfying the specific composition range, and the complex oxide is contained as the principal component.

The dielectric porcelain composition of the invention can provide a dielectric constant of from 4.5 to 6.0 and a Q value of 1,000 or more at 60 GHz, which are optimum for a high frequency circuit. Furthermore, the sintering conditions can be improved without greatly deteriorating the characteristics of the dielectric porcelain composition, whereby the production thereof becomes easy to remarkably improve the mass productivity. Moreover, a high frequency circuit, such as a microwave integrated circuit, can be produced with high reliability by using the dielectric porcelain composition of the invention.

The dielectric porcelain composition of the invention can be applied to various electronic parts requiring a low dielectric constant and a high Q value, for example, to an electronic circuit board, a dielectric porcelain of a dielectric resonator, a dielectric strip, a dielectric waveguide and a dielectric antenna.

A dielectric resonator using the dielectric porcelain composition of the invention will be described below. As shown in FIG. 1, the dielectric resonator is constituted in such a manner that a dielectric porcelain 1 for resonance is attached on a dielectric board 3 through a dielectric supporting member 2 and is electromagnetically coupled to a strip line 4 formed on the dielectric board 3 by utilizing an electromagnetic field H leaking outside the dielectric porcelain 1, which are housed in a metallic container 5. The dielectric supporting member 2 and/or the dielectric board 3 are formed with the dielectric porcelain composition. The dielectric porcelain 1 has a higher dielectric constant than the dielectric supporting member 2 and is formed with, for example, alumina ceramics having a dielectric constant of about 10.

In the dielectric resonator of the invention, the dielectric supporting member has a low dielectric constant and a large Q value, and thus leakage of the electric field of the dielectric porcelain through the dielectric supporting member can be controlled, whereby a resonance system of high unloaded Q can be constituted. Furthermore, the dielectric board has a low dielectric constant, and thus the impedance can be increased without reduction in the line width of the strip line. According to the constitution, a high frequency circuit, such as a microwave integrated circuit, can be produced with high reliability.

Figure 2:
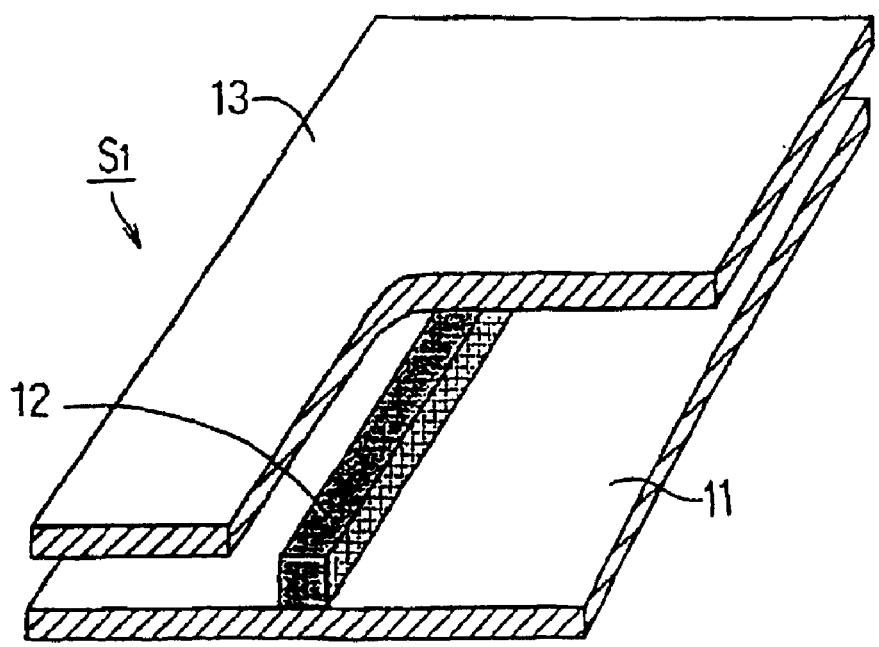
FIG. 2 is a partially cutaway perspective view showing a basic constitutional example of an NRD guide of the invention and the conventional art.

The NRD guide of the invention will be described below. As shown in FIG. 2, the NRD guide has such a basic constitution that a dielectric strip 12 comprising the dielectric porcelain composition intervenes between a pair of parallel flat conductive bodies 11 and 13 arranged at a distance of $\lambda/2$ or less, in which $\lambda$ is the wavelength of the high frequency signal. The dielectric porcelain composition is used as the material of the dielectric strip 12, and the dielectric porcelain composition has a dielectric constant of from 4.5 to 6. When the dielectric constant is less than 4.5, conversion of an electromagnetic wave in the LSM mode to the LSE mode becomes large to increase the loss, whereas when the dielectric constant exceeds 6, it is necessary that the width of the dielectric strip 12 becomes extremely small upon using at a frequency of 50 GHz or more, whereby such a problem occurs that processing becomes difficult, and the strength is deteriorated. The dielectric strip 12 exhibits such characteristics that the Q value is 1,000 or more at a frequency of 60 GHz, which are sufficient characteristics as a transmission guide used for a microwave band and a millimeter wave band in recent years.

According to the characteristics of the dielectric strip 12 described in the foregoing, the NRD guide of the invention can be applied to a high frequency circuit utilizing a high frequency signal of a several tens to several hundreds GHz band, and is particularly preferably applied to a high frequency band of 50 GHz or higher, and especially 70 GHz or higher. Specifically, the NRD guide of the invention can be used in a wireless LAN system and a millimeter wave radar for automobiles. For example, a millimeter wave is guided by the dielectric strip 12 to irradiate barriers around an automobile and other automobiles, then the reflected wave is received by another dielectric guide and combined with the original high frequency signal in the other dielectric strip to obtain an intermediate frequency signal, which is then analyzed to obtain distances to the barriers and the other automobiles and movement speeds thereof.

The parallel flat conductive bodies 11 and 13 may preferably be formed with a conductor plate of, for example, Cu, Al, Fe, Ag, Au, Pt or SUS (stainless steel), from the standpoint of high electric conductivity and workability, and an insulating plate having a layer of these conductors formed on the surface thereof may also be used.

The dielectric strip can also be applied to various kinds of electronic parts, electronic circuits and photoelectronic circuits utilizing a dielectric strip for transmitting a high frequency signal, as well as an NRD guide.

The nonradiative dielectric strip of the invention has a dielectric constant of the dielectric strip of about from 4.5 to 6, which is higher than the conventional resin material, such as Teflon, but lower than alumina ceramics, whereby the loss caused by conversion of the electromagnetic wave in the LSM mode to the LSE mode can be decreased. When a dielectric porcelain having a Q value of 1,000 or more at a using frequency of 60 GHz is used, the transmission loss can be small, and the width of the dielectric strip is not necessarily extremely narrow to easily form the dielectric strip, whereby the dielectric strip can be produce at a low cost with high accuracy. Furthermore, since the dielectric constant of the dielectric strip is higher than that of the resin material, such as Teflon, the influence of the resin material can be suppressed even when a supporting jig and a circuit board of dielectric strip are formed with the resin material and placed in the vicinity of the dielectric guide. Accordingly, an NRD guide of a small size and a low cost with a high degree of freedom on production can be constituted.

The invention is not construed as being limited to the foregoing embodiments, but various changes can be conducted without deviation from the substance of the invention.

The invention will be further described with reference to the following example.

EXAMPLES

A dielectric porcelain composition was produced by the following steps (1) to (3).

(1) $MgCO_3$ powder having a purity of 99.0% by weight, $Al_2O_3$ powder having a purity of 99.7% by weight, $SiO_2$ powder having a purity of 99.4% by weight and $K_2O_3$ powder having a purity of 99.0% by weight as raw material powder were respectively weighed to make the compositions of Nos. 1 to 35 shown in Table 1 below. The compositions of the respective examples each was mixed in a wet state for 15 hours, followed by drying. The mixtures each was calcined at 1,200° C. for 2 hours and then pulverized to obtain powder.

(2) An appropriate amount of an organic resin binder and the amounts shown in Table 1 of an oxide of an alkali metal and an oxide of a rare earth element were added to the resulting powder, followed by granulation. The resulting granules were molded under a pressure of 1,000 kg/cm² to obtain cylindrical molded articles each having a diameter of 8 mm and a thickness (height) of 5 mm.

(3) The molded articles were sintered in the air at the temperatures shown in Table 1 for 90 minutes and then ground to be a cylindrical shape having a diameter of 5 mm and a thickness of 2.25 mm, so as to obtain various kinds of samples of dielectric porcelain composition having different compositions.

The samples were measured for the dielectric constant and the Q value at a frequency of about 60 GHz by a dielectric cylinder resonance method. The value of $\beta p(241)/\beta p(222)$ was measured by diffraction of an X-ray (wavelength: 1.5406 Å). The results obtained are shown in Table 1 below. The samples attached with asterisks in Table 1 are samples outside the scope of the invention.

TABLE 1

| No. | MgO (mol %) | Al$_2$O$_3$ (mol %) | SiO$_2$ (mol %) | Alkali metal oxide (part by weight) | Additive (part by weight) | Dielectric constant | Q value (60 GHz) | βp (241)/βp (222) | Sintering temperature |
|---|---|---|---|---|---|---|---|---|---|
| 1* | 5 | 55 | 40 | K$_2$O 0.006 | — | 6.8 | 520 | 1.3 | 1,500 |
| 2 | 10 | 10 | 80 | K$_2$O 0.02 | — | 4.8 | 1,400 | 1.1 | 1.400 |
| 3 | 10 | 30 | 60 | K$_2$O 0.03 | — | 5.8 | 1,810 | 1.0 | 1,300 |
| 4 | 10 | 40 | 50 | K$_2$O 0.006 | — | 5.8 | 1,850 | 1.3 | 1,420 |
| 5 | 15 | 35 | 50 | K$_2$O 0.02 | — | 5.6 | 2,121 | 1.1 | 1,400 |
| 6 | 17.5 | 17.5 | 65 | K$_2$O 0.03 | — | 4.8 | 2,040 | 1.0 | 1,350 |
| 7 | 20 | 40 | 40 | K$_2$O 0.006 | — | 5.6 | 1,010 | 1.3 | 1,350 |
| 8 | 22.2 | 22.2 | 55.6 | K$_2$O 0.006 | — | 4.8 | 2,880 | 1.3 | 1,440 |
| 9 | 22.2 | 22.2 | 55.6 | K$_2$O 0.02 | — | 4.8 | 2,870 | 1.1 | 1,440 |
| 10 | 22.2 | 22.2 | 55.6 | K$_2$O 0.03 | — | 4.8 | 2,810 | 1.0 | 1,440 |
| 11 | 22.2 | 22.2 | 55.6 | K$_2$O 0.05 | — | 4.8 | 1,500 | 0.9 | 1,440 |
| 12 | 22.2 | 22.2 | 55.6 | K$_2$O 0.08 | — | 4.8 | 1,120 | 0.9 | 1,440 |
| 13 | 22.2 | 22.2 | 55.6 | K$_2$O 0.1 | — | 4.8 | 1,060 | 0.8 | 1,440 |
| 14* | 22.2 | 22.2 | 55.6 | K$_2$O 0.15 | — | 4.9 | 630 | 0.7 | 1,440 |
| 15* | 22.2 | 22.2 | 55.6 | K$_2$O 0.3 | — | 4.9 | 490 | 0.7 | 1,440 |
| 16 | 22.2 | 22.2 | 55.6 | Na$_2$O 0.03 | — | 4.8 | 2,300 | 1.0 | 1,440 |
| 17* | 22.2 | 22.2 | 55.6 | Na$_2$O 0.3 | — | 4.9 | 500 | 0.7 | 1,440 |
| 18 | 25 | 17 | 58 | K$_2$O 0.006 | — | 5.1 | 2,490 | 1.3 | 1,300 |
| 19 | 25 | 27 | 48 | K$_2$O 0.02 | — | 5.6 | 2,770 | 1.1 | 1,300 |
| 20 | 25.5 | 30 | 44.5 | K$_2$O 0.03 | — | 5.8 | 2,120 | 1.0 | 1,300 |
| 21 | 30 | 10 | 60 | K$_2$O 0.006 | — | 5.2 | 1,500 | 1.3 | 1,300 |
| 22 | 30 | 30 | 40 | K$_2$O 0.02 | — | 5.6 | 2,500 | 1.1 | 1,350 |
| 23 | 35 | 20 | 45 | K$_2$O 0.03 | — | 6.0 | 2,060 | 1.0 | 1,300 |
| 24 | 35 | 35 | 30 | K$_2$O 0.006 | — | 5.8 | 2,080 | 1.3 | 1,400 |
| 25 | 40 | 10 | 50 | K$_2$O 0.02 | — | 5.8 | 1,980 | 1.1 | 1,300 |
| 26 | 40 | 20 | 40 | K$_2$O 0.03 | — | 5.5 | 1,020 | 1.0 | 1,250 |
| 27 | 40 | 40 | 20 | K$_2$O 0.006 | — | 6.0 | 1,470 | 1.3 | 1,300 |
| 28* | 40 | 50 | 10 | K$_2$O 0.006 | — | 7.9 | 520 | 1.3 | 1,400 |
| 29* | 58 | 10 | 32 | K$_2$O 0.006 | — | 7.5 | 1,250 | 1.3 | 1,220 |
| 30 | 22.2 | 22.2 | 55.6 | K$_2$O 0.006 | Yb$_2$O$_3$ 0.1 | 4.8 | 2,910 | 1.3 | 1,430 |
| 31 | 22.2 | 22.2 | 55.6 | K$_2$O 0.006 | Yb$_2$O$_3$ 1.0 | 4.8 | 2,670 | 1.3 | 1,400 |
| 32 | 22.2 | 22.2 | 55.6 | K$_2$O 0.006 | Yb$_2$O$_3$ 5.0 | 4.8 | 2,750 | 1.3 | 1,380 |
| 33 | 22.2 | 22.2 | 55.6 | K$_2$O 0.006 | Yb$_2$O$_3$ 7.0 | 4.9 | 3,010 | 1.3 | 1,380 |
| 34 | 22.2 | 22.2 | 55.6 | K$_2$O 0.006 | Yb$_2$O$_3$ 10.0 | 5.0 | 3,010 | 1.3 | 1,380 |
| 35 | 22.2 | 22.2 | 55.6 | K$_2$O 0.006 | Yb$_2$O$_3$ 15.0 | 5.4 | 2,100 | 1.3 | 1,380 |

Note: Samples with asterisks (Nos. 1, 14, 15, 17, 28 and 29) are outside the scope of the invention.

As shown in Table 1, the dielectric porcelain composition according to the invention had a dielectric constant of from 4.5 to 6 and a high Q value of 1,000 or more at a measuring frequency of 60 GHz.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A dielectric resonator comprising:

a dielectric board;

a dielectric supporting member; and a dielectric porcelain for resonance having a higher dielectric constant than that of the supporting member, the dielectric porcelain provided on the dielectric board via the dielectric supporting member, the dielectric board and/or the dielectric supporting member comprising a dielectric porcelain composition which comprises, as a principal component, a complex oxide having a molar composition $xMgO \cdot yAl_2O_3 \cdot zSiO_2$, wherein $10 \leq x \leq 40$, $10 \leq y \leq 40$, $20 \leq z \leq 80$, and $x+y+z=100$, a primary crystalline phase of the complex oxide being a $2MgO \cdot 2Al_2O_3 \cdot 5SiO_2$ phase, and a ratio of a (241) peak intensity $\beta p(241)$ and a (222) peak intensity $\beta p(222)$ of X-ray diffraction of a $\beta$ phase of the primary crystalline phase being $0.8 \leq \beta p(241)/\beta p(222) \leq 1.3$.

2. The dielectric resonator of claim 1, wherein the dielectric porcelain composition contains 0.1 part by weight or less of an alkali metal element in terms of an oxide per 100 parts by weight of the complex oxide.

3. The dielectric resonator of claim 2, wherein the alkali metal element is potassium.

4. The dielectric resonator of claim 1, wherein the, dielectric porcelain composition contains 0.1 to 15 parts by weight of a rare earth element in terms of an oxide per 100 parts by weight of the complex oxide.

5. The dielectric resonator of claim 4, wherein the rare earth element is at least one selected from the group consisting of Tb, Dy, Ho, Er, Yb and Lu.

6. A nonradiative dielectric strip comprising:

a pair of parallel flat conductive bodies arranged with a distance of ½ or less of a wavelength of a high frequency signal; and a dielectric strip disposed between the parallel flat conductive bodies, for transmitting the high frequency signal, the dielectric strip comprising a dielectric porcelain composition which comprises, as a principal component, a complex oxide having a molar composition $xMgO \cdot yAl_2O_3 \cdot zSiO_2$, wherein $10 \leq x \leq 40$, $10 \leq y \leq 40$, $20 \leq z \leq 80$, and $x+y+z=100$, a primary crystalline phase of the complex oxide being a $2MgO \cdot 2Al_2O_3 \cdot 5SiO_2$ phase, and a ratio of a (241) peak intensity $\beta p(241)$ and a (222) peak intensity $\beta p(222)$ of X-ray diffraction of a $\beta$ phase of the primary crystalline phase being $0.8 \leq \beta p(241)/\beta p(222) \leq 1.3$.

7. The nonradiative dielectrics strip of claim 6, where the dielectric porcelain composition contains 0.1 part by weight or less of an alkali metal element in terms of an oxide per 100 parts by weight of the complex oxide.

8. The nonradiative dielectric strip of claim 7, wherein the alkali metal element is potassium.

9. The nonradiative dielectric strip of claim 6, wherein the dielectric porcelain composition contains 0.1 to 15 parts by weight of a rare earth element in terms of an oxide per 100 parts by weight of the complex oxide.

10. The nonradiative dielectric strip of claim 9, wherein the rare earth element is at least one selected from the group consisting of Tb, Dy, Ho, Er, Yb and Lu.

11. The nonradiative dielectric strip of claim 6, wherein a dielectric constant of the dielectric porcelain composition is from 4.5 to 6.

* * * * *